United States Patent
Kobayashi et al.

(10) Patent No.: US 8,605,500 B2
(45) Date of Patent: Dec. 10, 2013

(54) MULTILEVEL NONVOLATILE SEMICONDUCTOR MEMORY SYSTEM

(75) Inventors: Naoki Kobayashi, Tokyo (JP); Mitsuaki Honma, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 13/050,431

(22) Filed: Mar. 17, 2011

(65) Prior Publication Data

US 2012/0054416 A1 Mar. 1, 2012

(30) Foreign Application Priority Data

Aug. 27, 2010 (JP) ................. 2010-191368

(51) Int. Cl.
*G11C 11/34* (2006.01)
(52) U.S. Cl.
USPC ............. 365/185.03; 365/185.24; 365/185.19
(58) Field of Classification Search
USPC ............. 365/185.03, 185.24, 185.19
See application file for complete search history.

(56) References Cited

U.S. PATENT DOCUMENTS

| 7,505,315 | B2 | 3/2009 | Honma et al. | |
|---|---|---|---|---|
| 2009/0073764 | A1* | 3/2009 | Honma et al. | 365/185.03 |
| 2010/0259980 | A1* | 10/2010 | Futatsuyama | 365/185.03 |
| 2013/0094294 | A1* | 4/2013 | Kwak et al. | 365/185.03 |

FOREIGN PATENT DOCUMENTS

| JP | 11-317095 | 11/1999 |
|---|---|---|
| JP | 2000-331491 | 11/2000 |
| JP | 2002-100192 | 4/2002 |
| JP | 2006-277786 | 10/2006 |
| JP | 2007-287207 | 11/2007 |
| JP | 2008-65939 | 3/2008 |
| JP | 2008-65978 | 3/2008 |
| JP | 2008-146772 | 6/2008 |
| JP | 2009-59453 | 3/2009 |
| JP | 2009-76116 | 4/2009 |
| JP | 2009-104763 | 5/2009 |
| JP | 2009-134799 | 6/2009 |
| JP | 2009-259326 | 11/2009 |
| JP | 2009-282696 | 12/2009 |
| JP | 2010-9733 | 1/2010 |
| JP | 2010-79774 | 4/2010 |
| JP | 2010-102751 | 5/2010 |
| JP | 2010-160873 | 7/2010 |
| JP | 2011-510428 | 3/2011 |

OTHER PUBLICATIONS

First Office Action issued Jan. 8, 2013 in Japanese Patent Application No. 2010-191368 (with English translation).

* cited by examiner

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

According to one embodiment, a system includes a memory, a controller which controls an operation of the memory in a data program, and data bus which connects the memory to the controller. The memory comprises a memory cell array with memory cells which have a bit assignment to $2^x$ (x is an integer number of 3 or more) threshold distributions, each memory cell storing x bits, and a control circuit which controls the data program of x bits to the memory cells. The controller comprises a first step generating y bit (y is an integer number and y<x) based on x bits, transferring y bit to the memory, and generating $2^y$ threshold distributions based on y bit in the memory, and a second step executing after the first step, transferring x bits to the memory, and generating the $2^x$ threshold distributions based on x bits in the memory.

16 Claims, 19 Drawing Sheets

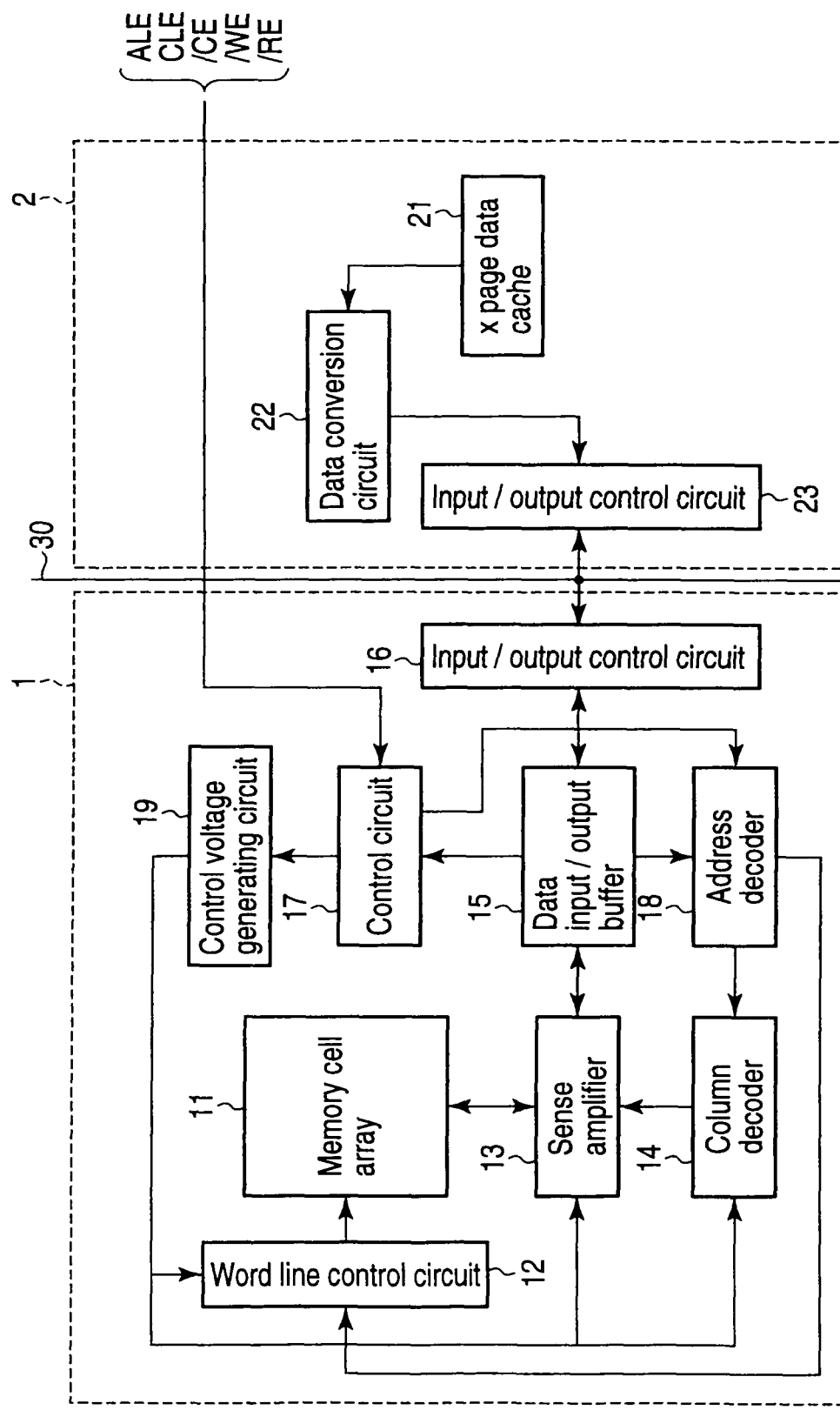
F I G. 1

| Threshold level after finish of first step | A | | | | B | | | |
|---|---|---|---|---|---|---|---|---|
| Third page data | 1 | 1 | 1 | 0 | 0 | 0 | 0 | 1 |
| Second page data | 1 | 1 | 0 | 0 | 1 | 1 | 0 | 0 |
| First page data | 1 | 0 | 0 | 0 | 0 | 1 | 1 | 1 |
| Generated data d | 1 | 1 | 1 | 1 | 0 | 0 | 0 | 0 |

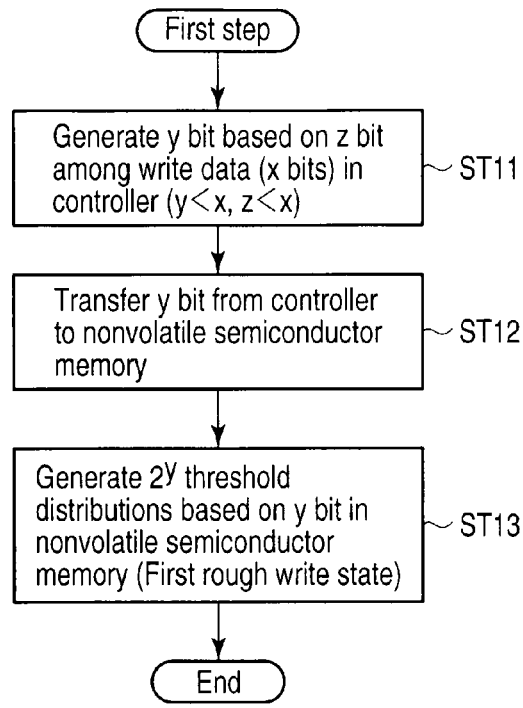
FIG. 11
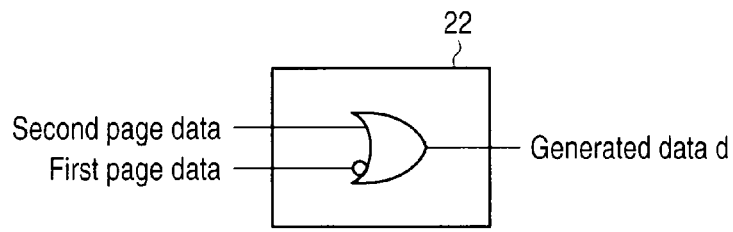
FIG. 12
| Threshold level after finish of first step | A | | | | | | B | |
|---|---|---|---|---|---|---|---|---|
| Second page data | 1 | 1 | 0 | 0 | 1 | 1 | 0 | 0 |
| First page data | 1 | 0 | 0 | 0 | 0 | 1 | 1 | 1 |
| Generated data d | 1 | 1 | 1 | 1 | 1 | 1 | 0 | 0 |
FIG. 13

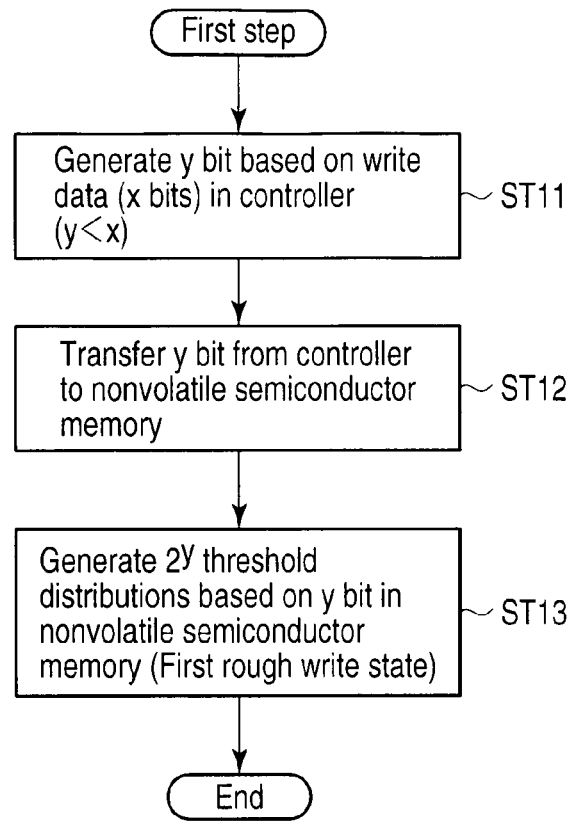
F I G. 16
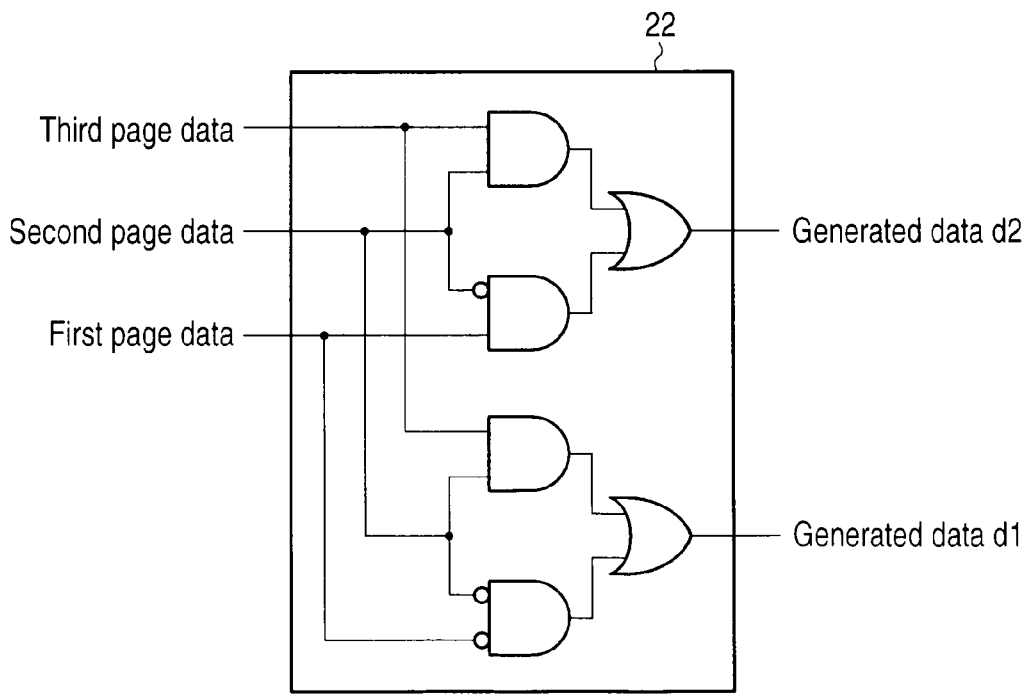
F I G. 17

| Threshold level after finish of first step | A | | B | | C | | D | |
|---|---|---|---|---|---|---|---|---|
| Third page data | 1 | 1 | 1 | 0 | 0 | 0 | 0 | 1 |
| Second page data | 1 | 1 | 0 | 0 | 1 | 1 | 0 | 0 |
| First page data | 1 | 0 | 0 | 0 | 0 | 1 | 1 | 1 |
| Generated data d2 | 1 | 1 | 0 | 0 | 0 | 0 | 1 | 1 |
| Generated data d1 | 1 | 1 | 1 | 1 | 0 | 0 | 0 | 0 |

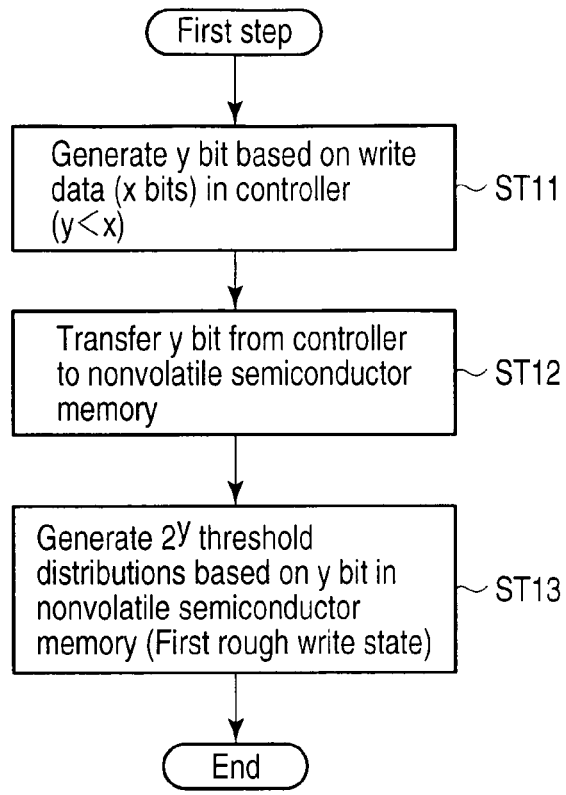
F I G. 23
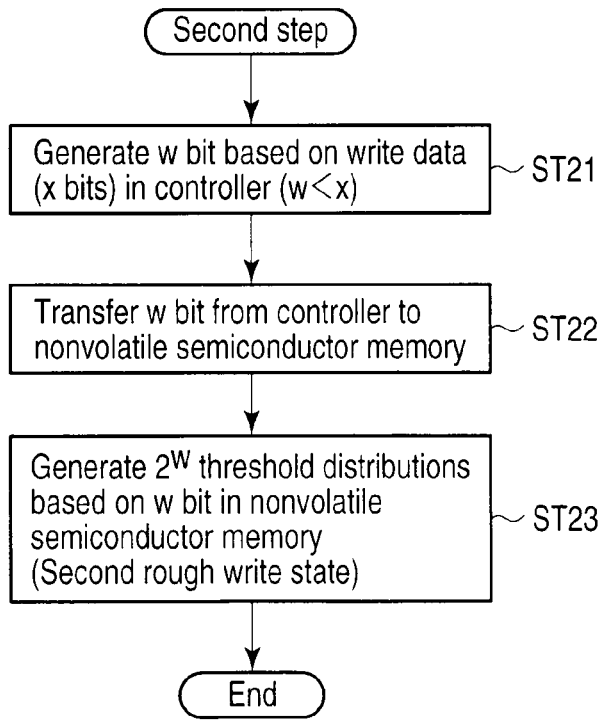
F I G. 24

| Threshold level after finish of second step | A1 | | A2 | | B1 | | B2 | |
|---|---|---|---|---|---|---|---|---|
| Third page data | 1 | 1 | 1 | 0 | 0 | 0 | 0 | 1 |
| Second page data | 1 | 1 | 0 | 0 | 1 | 1 | 0 | 0 |
| First page data | 1 | 0 | 0 | 0 | 0 | 1 | 1 | 1 |
| Generated data d2 | 1 | 1 | 0 | 0 | 0 | 0 | 1 | 1 |
| Generated data d1 | 1 | 1 | 1 | 1 | 0 | 0 | 0 | 0 |
F I G. 2 5
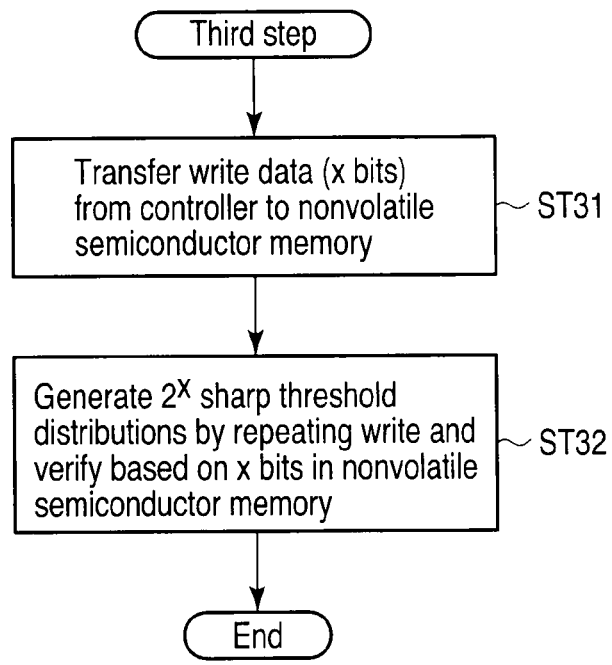
F I G. 2 6

MULTILEVEL NONVOLATILE SEMICONDUCTOR MEMORY SYSTEM

CROSS-REFERENCE TO RELATED APPLICATIONS

This application is based upon and claims the benefit of priority from Japanese Patent Application No. 2010-191368, filed Aug. 27, 2010; the entire contents of which are incorporated herein by reference.

FIELD

Embodiments described herein relate generally to a multilevel nonvolatile semiconductor memory system.

BACKGROUND

To realize a high capacity, a recent nonvolatile semiconductor memory adopts a multilevel technology for storing bits in one memory cell. However, in this technology, margins for threshold distributions in a fixed voltage range are small, and an erroneous write/read problem occurs. Thus, an error correction technology for correcting wrong data into correct data is adopted in addition to the multilevel technology, thereby realizing high reliability of the nonvolatile semiconductor memory.

However, a satisfactory countermeasure for an increase in write time which is another undesirable effect of the multilevel technology has not been found yet. For example, if the number of bits to be stored in one memory cell increases to 3, 4, or 5, a time required for transferring data from a controller to the nonvolatile semiconductor memory also increases in proportion to this increment.

BRIEF DESCRIPTION OF THE DRAWINGS

FIG. 1 shows a memory system.
FIG. 11 shows a flow chart of the first step.
FIG. 12 shows an example of a data conversion circuit.
FIG. 13 shows a truth table of the circuit of FIG. 12.
FIG. 16 shows a flow chart of the first step.
FIG. 17 shows an example of a data conversion circuit.
FIG. 23 shows a flow chart of the first step.
FIG. 24 shows a flow chart of the second step.
FIG. 25 shows a truth table of the circuit of FIG. 17.
FIG. 26 shows a flow chart of the third step.

DETAILED DESCRIPTION

Figure 2:
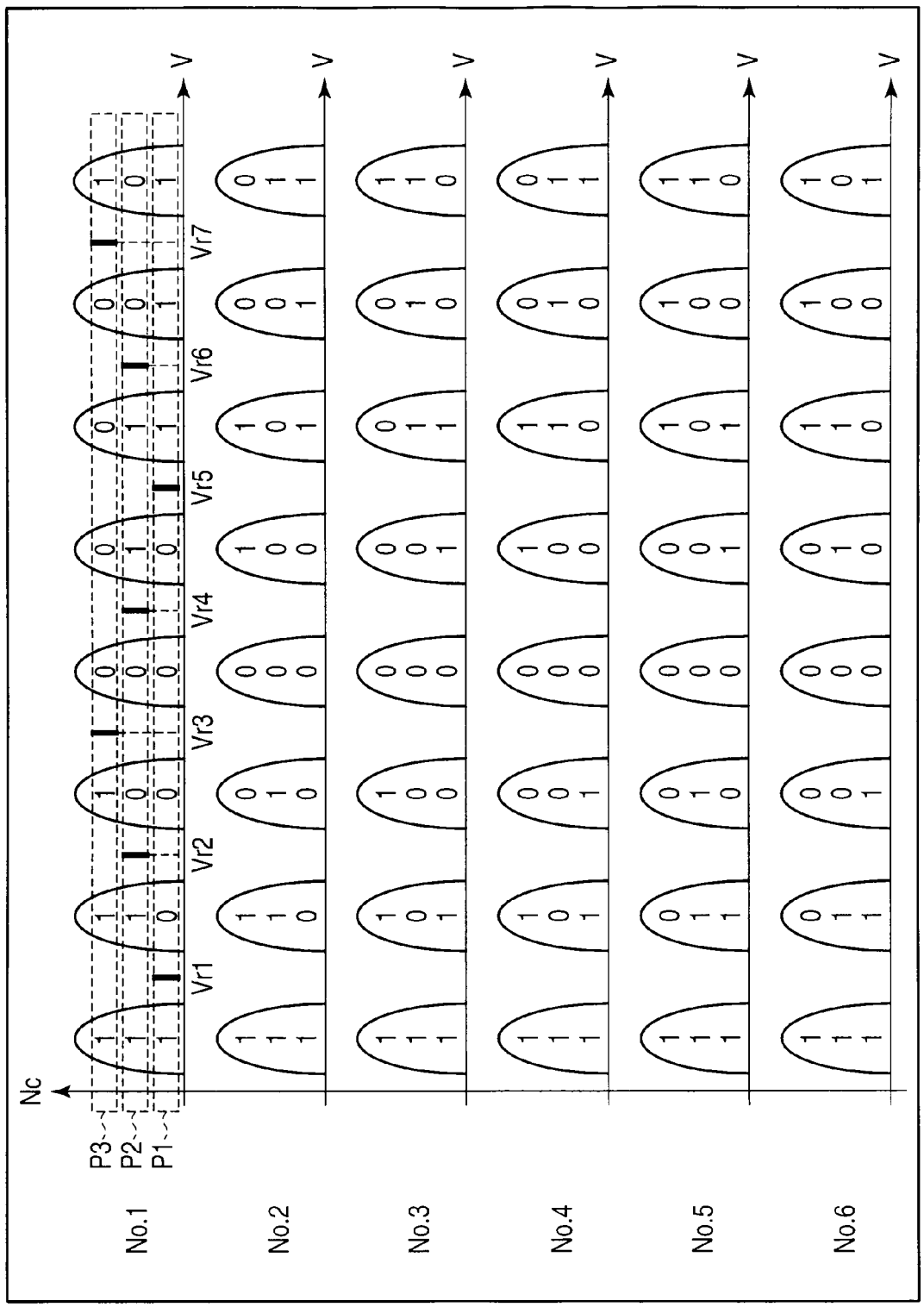
FIG. 2 shows an example of a bit assignment.

In general, according to one embodiment, a multilevel nonvolatile semiconductor memory system comprising: a nonvolatile semiconductor memory; a controller which controls an operation of the nonvolatile semiconductor memory in a data program; and data bus which connects the nonvolatile semiconductor memory to the controller, wherein the nonvolatile semiconductor memory comprises: a memory cell array with memory cells which have a bit assignment to $2^x$ (x is an integer number of 3 or more) threshold distributions, each memory cell storing x bits; and a control circuit which controls the data program of x bits to the memory cells, wherein the controller comprises: a first step generating y bit (y is an integer number and y<x) based on x bits, transferring y bit to the nonvolatile semiconductor memory, and generating $2^y$ threshold distributions based on y bit in the nonvolatile semiconductor memory, and a second step executing after the first step, transferring x bits to the nonvolatile semiconductor memory, and generating the $2^x$ threshold distributions based on x bits in the nonvolatile semiconductor memory.

1. Multilevel Nonvolatile Semiconductor Memory System

(1) Block Configuration

FIG. 1 shows an example of a multilevel nonvolatile semiconductor memory system.

The memory system in this example comprises nonvolatile semiconductor memory (e.g., an NAND flash memory) 1 and controller 2 configured to control an operation of the nonvolatile semiconductor memory 1.

A configuration of the nonvolatile semiconductor memory 1 is as follows.

Word line control circuit 12 is arranged at one end of a first direction (a direction along which word lines extend) of memory cell array 11 and configured to drive the word lines. Word line control circuit 12 includes a row decoder and also includes a selected gate line driver configured to drive a selected gate line.

Sense amplifier circuit 13 is arranged at one end of a second direction (a direction along which bit lines extend) of memory cell array 11, and utilized to read/write cell data. A read/write operation for cell data is carried out in, e.g., pages. Further, sense amplifier circuit 13 has latch circuits to read/write multilevel data.

Column decoder 14 selects one from columns (the bit lines) to serially transfer read/write data between sense amplifier circuit 13 and data input/output buffer 15.

Input/output control circuit 16 is configured to control input/output of data between nonvolatile semiconductor memory 1 and data bus 30. For example, write data is loaded to sense amplifier circuit 13 from controller 2 via input/output control circuit 16 and data input/output buffer 15.

Commands from controller 2 are input to control circuit 17 to be decoded. Furthermore, external control signals are input to control circuit 17. The external control signals include a chip enable signal /CE, a write enable signal /WE, a read enable signal /RE, an address latch enable signal ALE, and a command latch enable signal CLE.

Control circuit 17 controls read/write/erase operations for multilevel data based on the external control signals and the commands.

An address signal is input to address decoder 18 and transferred to word line control circuit 12 and column decoder 14. Control voltage generating circuit 19 is configured to generate a voltage required to read/write/erase multilevel data.

A configuration of controller 2 is as follows.

Input/output control circuit 23 is configured to control input/output of data between controller 2 and data bus 30. x page data cache 21 is configured to temporarily store, e.g., x bits (x is an integer equal to or above 3) as write data.

Data conversion circuit 22 has a function of converting x bits as write data into y bits (y is an integer, and y<x is achieved).

In this example, when storing x bits in one memory cell, a bit assignment is performed to $2^x$ threshold distributions. Moreover, for example, controller 2 executes a write operation at first, second, and third steps, whereby $2^y$ threshold distributions are generated at the first step, and $2^x$ threshold distributions are generated at the third step after the second step.

At the first step, data conversion circuit 22 is utilized to generate y bits required to generate the $2^y$ threshold distributions based on x bits as write data. The y bits generated by data conversion circuit 22 are transferred to nonvolatile semiconductor memory 1 through data bus 30.

(2) Example of Bit Assignment

Here, an example of a bit assignment when storing x bits (x is an integer equal to or above 3) in one memory cell will be explained. The bit assignment in FIG. 2 corresponds to an example when x=3.

The bit assignment is performed with respect to $2^x$ threshold distributions and satisfies the following two conditions.

Condition 1: one bit in x bits assigned to two threshold distributions adjacent to each other in $2^x$ threshold distributions is different.

Condition 2: two or more variation points of "0" and "1" are provided in page data consisting of a group of single bits in the x bits assigned to the $2^x$ threshold distributions.

Condition 1 is a condition for decreasing the number of wrong bits and for assuredly performing correction by the error correction circuit. According to the condition 1, a high reliability of the nonvolatile semiconductor memory can be secured. That is, when data is written into a single wrong threshold distribution shifted from a correct threshold distribution, a wrong bit in the x bits is necessarily one bit if Condition 1 is met.

Additionally, Condition 1 is also a condition for reading data of x bits by ($2^x$−1) read operations, which is a minimum number of times, by using each of ($2^x$−1) read potentials present between the $2^x$ threshold distributions at one time.

Condition 2 is a condition for averaging the number of times of read operations for each page to uniform a bit error rate in each page and improving a read speed.

For example, as shown in FIG. 2, when x=3, as a bit assignment meeting both Condition 1 and Condition 2, there are six patterns, i.e., No. 1 to No. 6.

Paying attention to the bit assignment of No. 1, a single bit is different in three bits assigned to each of two threshold distributions adjacent to each other, and two or more variation points of "0" and "1" are provided in page data consisting of a group of single bits in three bits assigned to each of eight threshold distributions.

Specifically, first page P1 has two variation points of "0" and "1", i.e., Vr1 and Vr5, second page P2 has three variation points of "0" and "1", i.e., Vr2, Vr4, and Vr6, and third page P3 has two variation points of "0" and "1", i.e., Vr3 and Vr7.

Further, even if wrong data [011] is written when correct write data is [010], a wrong bit is one bit alone in lowest first page P1. It is to be noted that values in [***] (* is "0" or "1") sequentially represent third page data, second page data, and first page data from the left-hand side.

Furthermore, two read operations using Vr1 and Vr5 as read potentials are required when reading data of first page P1, three read operations using Vr2, Vr4, and Vr6 as read potentials are required when reading data of second page P2, two read operations using Vr3 and Vr7 as read potentials are required when reading data of third page P3, and the number of read operations for each page is averaged.

According to the above-described bit assignment, a time required for transfer of data from the controller to the nonvolatile semiconductor memory can be reduced, and the high reliability of the nonvolatile semiconductor memory can be realized.

2. Embodiments (1) First Embodiment

Figure 3:
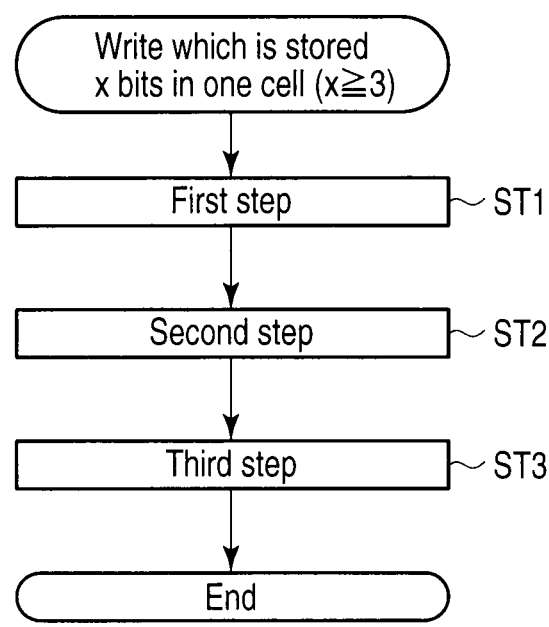
FIG. 3 shows a flow chart of a write step of a first embodiment.
Figure 4:
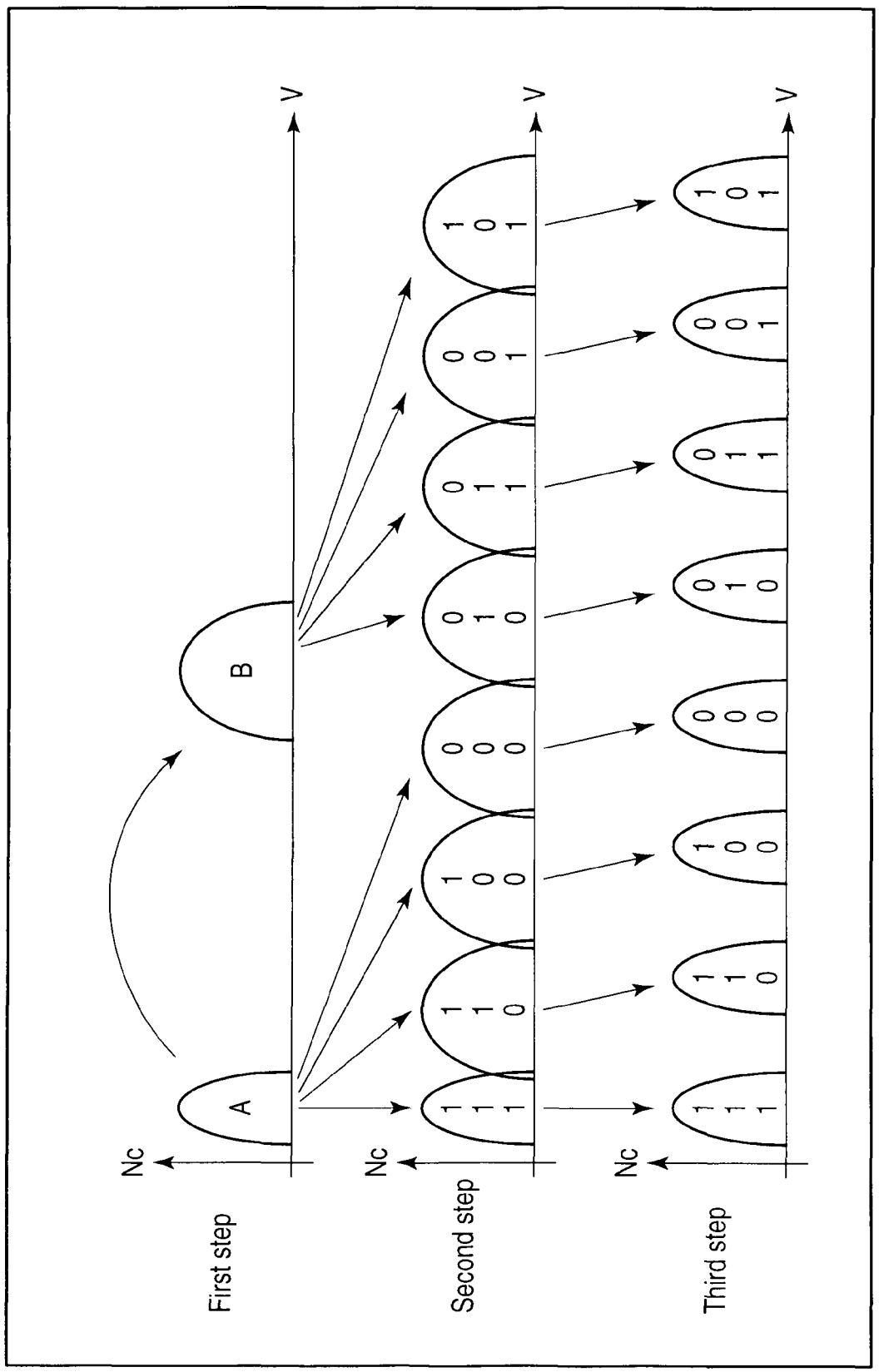
FIG. 4 shows threshold distributions generated by first to third steps.

FIG. 3 and FIG. 4 show write steps according to a first embodiment.

Multilevel data is written at first, second, and third steps. At the first step, two threshold distributions A and B are generated based on write data (three bits).

To perform this write operation, in general, the write data (the three bits) is transferred to the nonvolatile semiconductor memory from the controller, and whether the write operation is to be executed must be determined in the nonvolatile semiconductor memory based on the write data. However, in this case, a time required for transfer of the write data from the controller to the nonvolatile semiconductor memory is prolonged as the number of levels of data increases (as the number of bits in the write data increases).

Thus, in the first embodiment, at the first step, the controller generates one bit indicative of whether the write operation is to be executed based on the write data (the three bits). Specifically, the data conversion circuit in the controller is utilized to convert the write data (the three bits) into one bit. Moreover, this one bit is transferred to the nonvolatile semiconductor memory to generate the two threshold distributions A and B.

As a result, at the first step, the number of bits transferred from the controller to the nonvolatile semiconductor memory can be reduced, whereby a write time can be shortened.

At the second step, based on the write data (the three bits), eight threshold distributions [111], [110], [100], [000], [010], [011], [001], and [101] are generated. For example, the threshold distributions [111], [110], [100], and [000] are generated from the threshold distribution A, and the threshold distributions [010], [011], [001], and [101] are generated from the threshold distribution B.

At the third step, based on the write data (the three bits), write and verify operations are repeated to sharpen the eight threshold distributions [111], [110], [100], [000], [010], [011], [001], and [101].

The write steps according to the first embodiment will now be specifically explained hereinafter.

Figure 5:
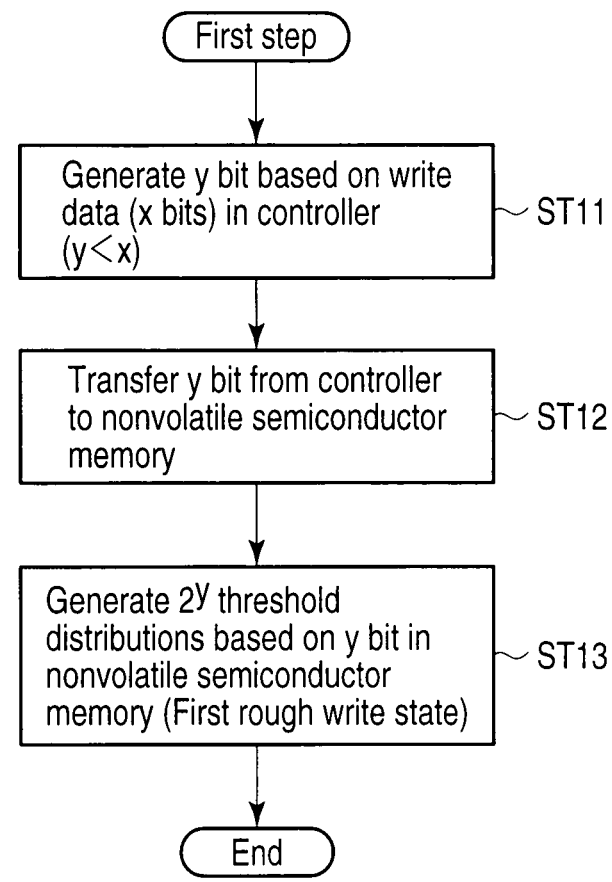
FIG. 5 shows a flow chart of the first step.

As shown in FIG. 5, at the first step, $2^y$ threshold distributions A and B are generated based on write data (x bits). However, in this example, x=3 and y=1.

First, in the controller, y bit indicative of whether a write operation is to be executed is generated based on the write data (the x bits) (step ST11).

Figure 6:
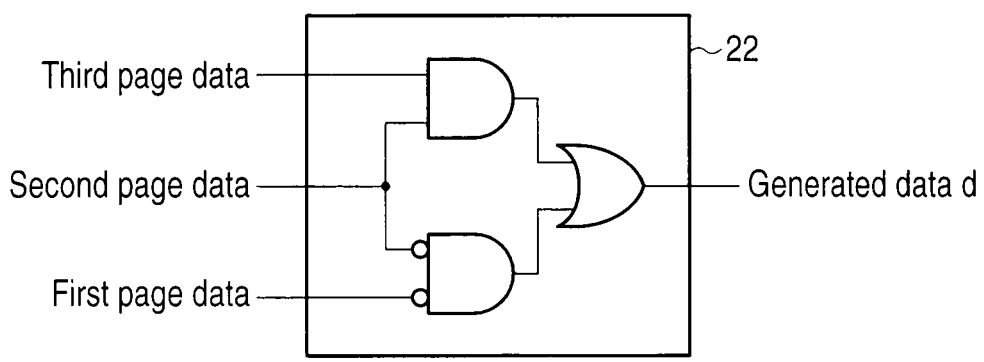
FIG. 6 shows an example of a data conversion circuit.

For example, when data conversion circuit 22 depicted in FIG. 6 is used, generated data (the y bit) d of "0" or "1" can be obtained in accordance with a value of first, second, and third page data.

Figures 7, 8:
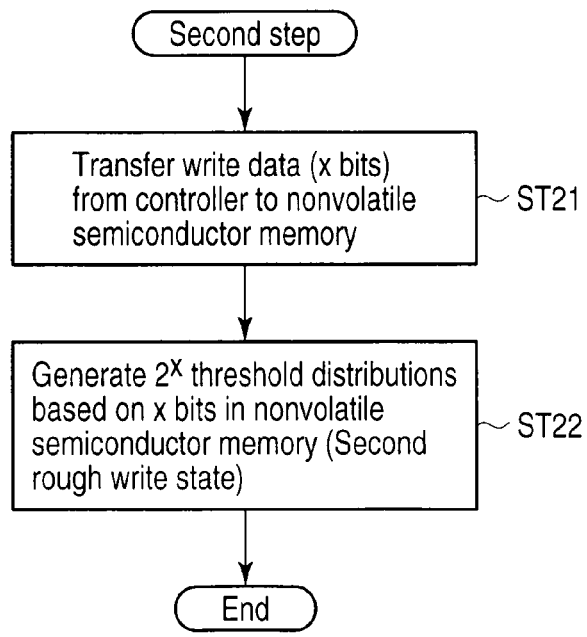
FIG. 7 shows a truth table of the circuit of FIG. 6.
FIG. 8 shows a flow chart of the second step.

That is, as shown in FIG. 7, when the value of the first, second, and third page data [the third page data, the second page data, and the first page data] is [111], [110], [100], or [000], the generated data d is "1". Additionally, when the value of the first, second, and third page data [the third page data, the second page data, and the first page data] is [010], [011], [001], or [101], the generated data d is "0".

Subsequently, this generated data (the y bit) d is transferred from the controller to the nonvolatile semiconductor memory (step ST12).

Further, in the nonvolatile semiconductor memory, the write operation is executed based on the generated data (the y bit) d.

Therefore, for example, the write operation is inhibited when the generated data d is "1", and the write operation is permitted when the generated data d is "0", whereby the $2^y$ threshold distributions A and B can be generated based on the generated data (the y bit) d.

It is to be noted that a state after end of the first step is called, e.g., a first rough write state.

As shown in FIG. 8, at the second step, $2^x$ threshold distributions [111], [110], [100], [000], [010], [011], [001], and [101] are generated based on the write data (the x bits). However, in this example, x=3.

First, the write data (the x bits) is transferred from the controller to the nonvolatile semiconductor memory (step ST21).

Furthermore, in the nonvolatile semiconductor memory, based on the write data (the x bits), the write operation is executed to generate the $2^x$ threshold distributions [111], [110], [100], [000], [010], [011], [001], and [101] (step ST22).

For example, the threshold distributions [111], [110], [100], and [000] are generated from the threshold distribution A, and the threshold distributions [010], [011], [001], and [101] are generated from the threshold distribution B.

At the second step, a verify level that is utilized to verify whether the write operation has been completed is set to be lower than a verify level that is utilized to obtain a final threshold distribution (verify pass conditions are moderated).

It is to be noted that a state after end of the second step is called, e.g., a second rough write state.

Figure 9:
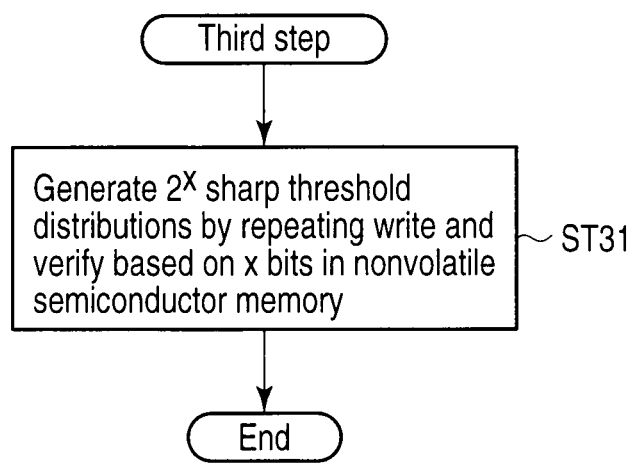
FIG. 9 shows a flow chart of the third step.

As shown in FIG. 9, at the third step, based on the write data (the x bits), write and verify operations are repeated to sharpen the $2^x$ threshold distributions [111], [110], [100], [000], [010], [011], [001], and [101]. However, in this example, x=3 (step ST31).

At the third step, the verify level utilized to verify whether the write operation has been completed is set to the verify level utilized to obtain a final threshold distribution.

At the third step, the write data (the x bits) is again transferred from the controller to the nonvolatile semiconductor memory.

However, when means for storing the write data in the nonvolatile semiconductor memory even after the verify pass at the second step is provided, the write data (the x bits) does not have to be again transferred at the third step. That is, the write data, which has been transferred from the controller to the nonvolatile semiconductor memory at the second step, can be utilized to execute the write operation.

The first embodiment can be modified as follows.

Figure 10:
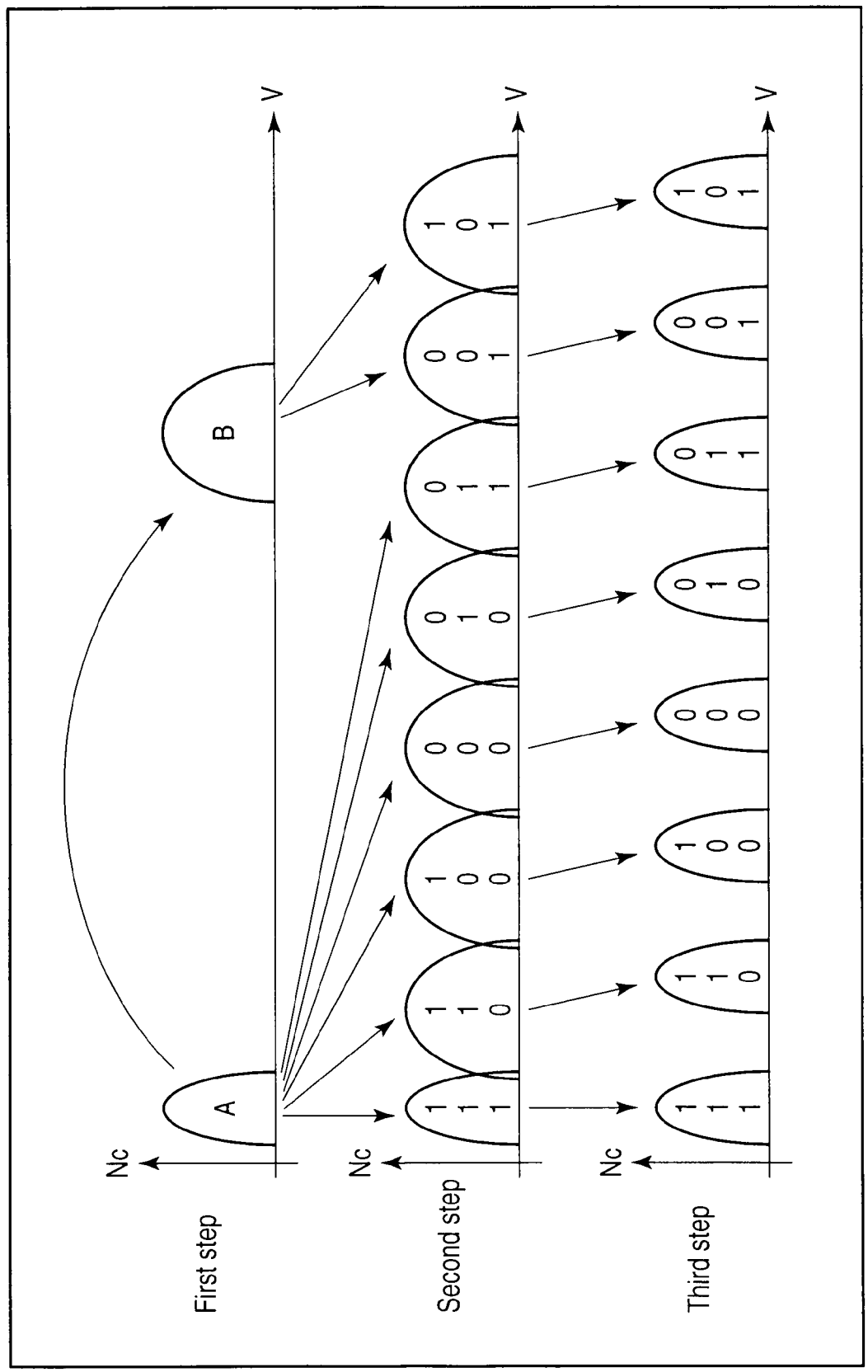
FIG. 10 shows threshold distributions generated by first to third steps.

FIG. 10 shows write steps as a modification of the first embodiment.

This modification is characterized in that y bit is generated based on z bits (z is an integer, and z<x is achieved) in the write data (the x bits) at the first step.

For example, one bit indicative of whether the write operation is to be executed is generated based on lower two bits (the first and second page data) in the write data (the three bits).

The write steps in the modification will now be specifically described.

As shown in FIG. 11, $2^y$ threshold distributions A and B are generated based on z bits in the write data (the x bits). However, in this example, x=3, y=1, and z=2.

First, in the controller, based on the lower z bits in the write data (the x bits), the y bit indicative of whether the write operation is to be executed is generated (step ST11).

For example, when data conversion circuit 22 shown in FIG. 12 is used, generated data (the y bit) d of "0" or "1" can be obtained in accordance with a value of the first and second page data.

That is, as shown in FIG. 13, when a value of the first and second page data [the second page data and the first page data] is [01], the generated data d is "0". Furthermore, when the value of the first and second page data is any other value, the generated data d is "1".

Then, this generated data (the y bit) d is transferred from the controller to the nonvolatile semiconductor memory (step ST12).

Moreover, in the nonvolatile semiconductor memory, based on the generated data (the y bit) d, the write operation is executed (step ST13).

Therefore, for example, the write operation is inhibited when the generated data d is "1", and the write operation is permitted when the generated data d is "0", whereby the $2^y$ threshold distributions A and B can be generated based on the generated data (the y bit) d.

It is to be noted that a state after end of the first step is called, e.g., a first rough write state like the first embodiment.

The second and third steps are the same as those in the first embodiment, thereby omitting a detailed description thereof. However, in this modification, at the second step, the threshold distributions [111], [110], [100], [000], [010], and [011] are generated from the threshold distribution A, and the threshold distributions [001] and [101] are generated from the threshold distribution B.

As described above, according to the first embodiment and its modification, since the data conversion circuit that generates a bit indicative of write inhibition/permission is provided on the controller side, a data transfer time from the controller to the nonvolatile semiconductor memory in the write operation can be reduced.

(2) Second Embodiment

Figure 14:
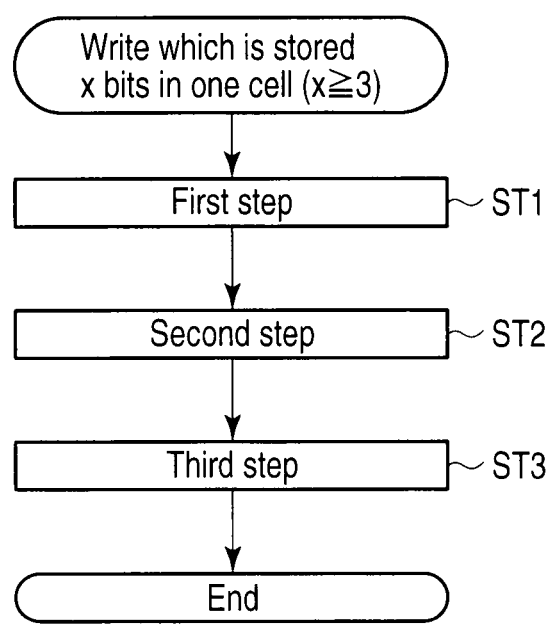
FIG. 14 shows a flow chart of a write step of a second embodiment.
Figure 15:
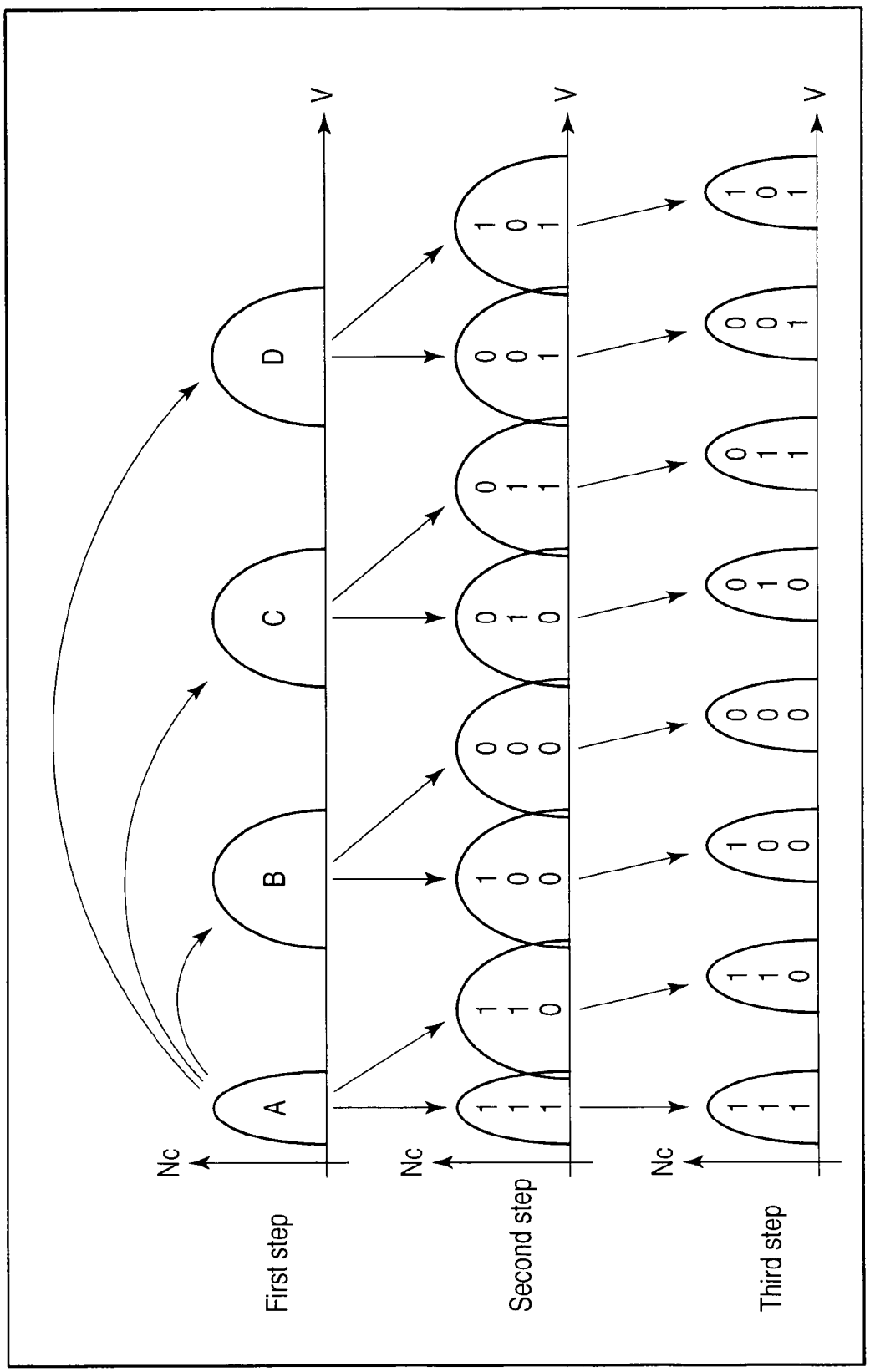
FIG. 15 shows threshold distributions generated by first to third steps.

FIG. 14 and FIG. 15 show write steps in a second embodiment.

Multilevel data is written at first, second, and third steps like the first embodiment. However, at the first step, four threshold distributions A, B, C, and D are generated based on write data (three bits).

Therefore, in a controller, two bits indicative of whether a write operation is to be executed are generated based on the write data (the three bits). Specifically, a data conversion circuit in the controller is utilized to convert the write data (the three bits) into two bits. Moreover, these two bits are transferred to a nonvolatile semiconductor memory to generate the four threshold distributions A, B, C, and D.

As a result, at the first step, the number of bits transferred to the nonvolatile semiconductor memory from the controller can be reduced, thereby shortening a write time.

At the second step, based on the write data (the three bits), eight threshold distributions [111], [110], [100], [000], [010], [011], [001], and [101] are generated.

For example, the threshold distributions [111] and [110] are generated from the threshold distribution A, the threshold distributions [100] and [000] are generated from the threshold distribution B, the threshold distributions [010] and [011] are generated from the threshold distribution C, and the threshold distributions [001] and [101] are generated from the threshold distribution D.

At the third step, based on the write data (the three bits), write and verify operations are repeated to sharpen the eight threshold distributions [111], [110], [100], [000], [010], [011], [001], and [101].

The write steps according to the second embodiment will now be specifically described hereinafter.

As shown in FIG. 16, at the first step, the $2^y$ threshold distributions A, B, C, and D are generated based on the write data (x bits). However, in this example, x=3 and y=2.

First, in the controller, based on the write data (the x bits), y bits indicative of whether the write operation is to be executed are generated (step ST11).

For example, when data conversion circuit 22 depicted in FIG. 17 is used, each generated data (the y bits) d2, d1 of "11", "01", "00", or "10" can be obtained in accordance with a value of first, second, and third page data.

Figures 18, 19:
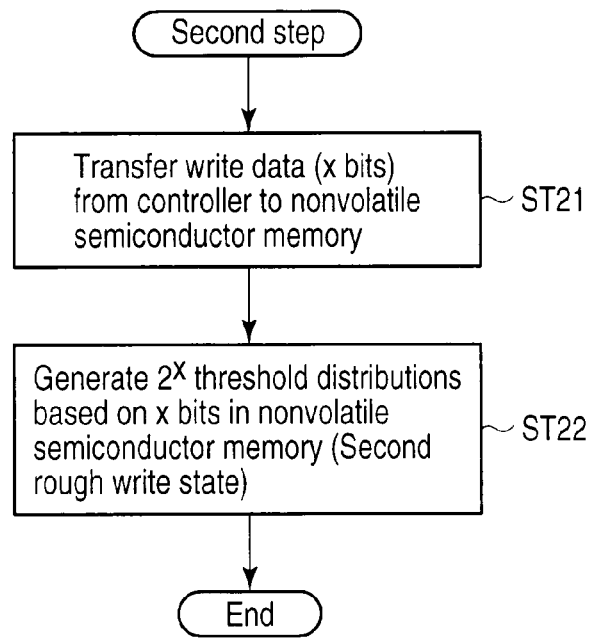
FIG. 18 shows a truth table of the circuit of FIG. 17.
FIG. 19 shows a flow chart of the second step.

That is, as shown in FIG. 18, each of the generated data d2, d1 is "11" when a value of the first, second, and third page data [the third page data, the second page data, and the first page data] is [111] or [110], and each of the generated data d2, d1 is "01" when the value of the first, second, and third page data [the third page data, the second page data, and the first page data] is [100] or [000].

Additionally, each of the generated data d2, d1 is "00" when the value of the first, second, and third page data [the third page data, the second page data, and the first page data] is [010] or [011], and each of the generated data d2, d1 is "10" when the value of the first, second, and third page data [the third page data, the second page data, and the first page data] is [001] or [101].

Then, each generated data (the y bits) d2, d1 is transferred to the nonvolatile semiconductor memory from the controller (step ST12).

Further, in the nonvolatile semiconductor memory, based on each generated data (the y bits) d2, d1, the write operation is executed (step ST13).

Therefore, for example, the write operation is inhibited when each generated data d2, d1 is "11", and the write operation is permitted when each generated data d2, d1 is "01", "00", or "10", whereby the $2^y$ threshold distributions A, B, C, and D can be generated based on each generated data (the y bits) d2, d1.

However, in the write permission, when a verify level is set to differ depending on a value of each generated data d2, d1, i.e., "01", "00", or "10", data can be written on each different threshold level.

It is to be noted that a state after end of the first step is called, e.g., a first rough write state.

As shown in FIG. 19, at the second step, based on the write data (x bits), $2^x$ threshold distributions [111], [110], [100], [000], [010], [011], [001], and [101] are generated. However, in this example, x=3.

First, the write data (the x bits) is transferred from the controller to the nonvolatile semiconductor memory (step ST21).

Further, in the nonvolatile semiconductor memory, based on the write data (the x bits), the write operation is executed to generate the $2^x$ threshold distributions [111], [110], [100], [000], [010], [011], [001], and [101] (step ST22).

For example, the threshold distributions [111] and [110] are generated from the threshold distribution A, the threshold distributions [100] and [000] are generated from the threshold distribution B, the threshold distributions [010] and [011] are generated from the threshold distribution C, and the threshold distributions [001] and [101] are generated from the threshold distribution D.

At the second step, a verify level that is utilized to verify whether the write operation has been completed is set to be lower than a verify level that is utilized to obtain a final threshold distribution (verify pass conditions are moderated).

It is to be noted that a state after end of the second step is called, e.g., a second rough write state.

Figure 20:
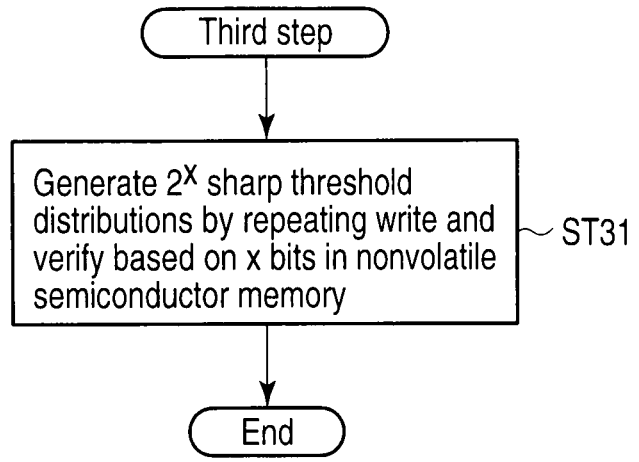
FIG. 20 shows a flow chart of the third step.

As shown in FIG. 20, at the third step, based on the write data (the x bits), the write and verify operations are repeated to sharpen the $2^x$ threshold distributions [111], [110], [100], [000], [010], [011], [001], and [101]. However, in this example, x=3 (step ST31).

At the third step, the verify level that is utilized to verify whether the write operation has been completed is set to the verify level that is utilized to obtain a final threshold distribution.

At the third step, the write data (the x bits) is again transferred from the controller to the nonvolatile semiconductor memory.

However, when means for storing the write data in the nonvolatile semiconductor memory even after verify pass at the second step is provided, the write data (the x bits) does not have to be again transferred at the third step. That is, the write data, which has been transferred from the controller to the nonvolatile semiconductor memory at the second step, can be utilized to execute the write operation.

As described above, according to the second embodiment, when the data conversion circuit that generates bits indicative of write inhibition/permission is provided on the controller side, a data transfer time from the controller to the nonvolatile semiconductor memory in the write operation can be shortened.

(3) Third Embodiment

Figure 21:
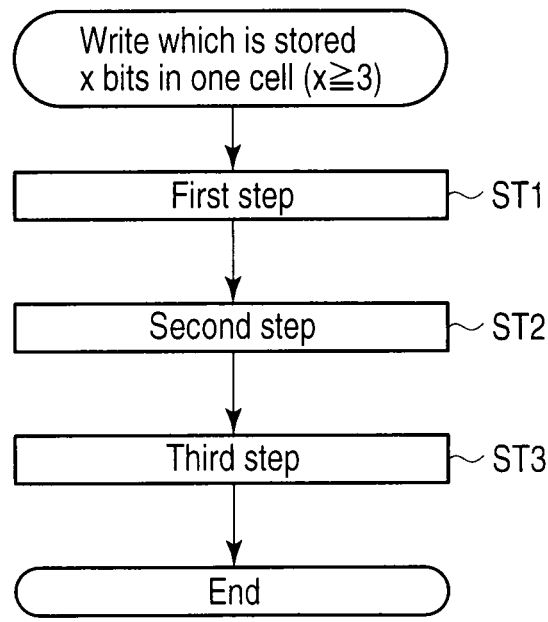
FIG. 21 shows a flow chart of a write step of a third embodiment.
Figure 22:
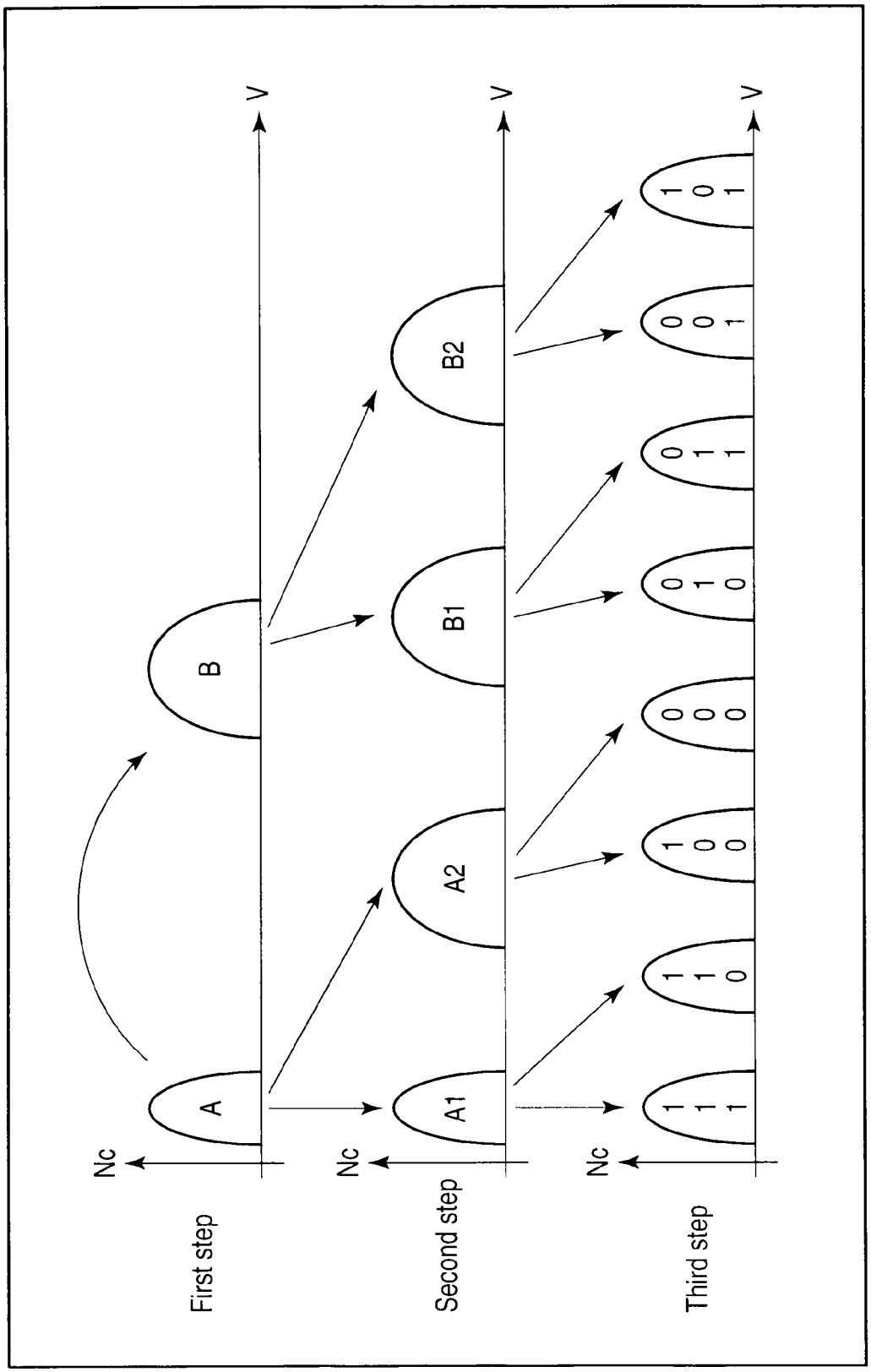
FIG. 22 shows threshold distributions generated by first to third steps.

FIG. 21 and FIG. 22 show write steps according to a third embodiment.

Multilevel data is written at first, second, and third steps like the first embodiment.

At the first step, two threshold distributions A and B are generated based on write data (three bits). Therefore, in a controller, one bit indicative of whether a write operation is to be executed is generated based on the write data (the three bits). Specifically, a data conversion circuit in the controller is utilized to convert the write data (the three bits) into one bit.

Further, this one bit is transferred to a nonvolatile semiconductor memory to generate two threshold distributions A and B.

Furthermore, at the second step, based on the write data (the three bits), four threshold distributions A1, A2, B1, and B2 are generated. Therefore, in the controller, two bits indicative of whether a write operation is to be executed are generated based on the write data (the three bits). Specifically, the data conversion circuit in the controller is utilized to convert the write data (the three bits) into two bits.

Moreover, the two bits are transferred to the nonvolatile semiconductor memory to generate the four threshold distributions A1, A2, B1, and B2.

As a result, at the first and second steps, the number of bits transferred to the nonvolatile semiconductor memory from the controller can be reduced, thereby shortening a write time.

At the third step, based on the write data (the three bits), eight threshold distributions [111], [110], [100], [000], [010], [011], [001], and [101] are generated.

For example, the threshold distributions [111] and [110] are generated from the threshold distribution A1, the threshold distributions [100] and [000] are generated from the threshold distribution A2, the threshold distributions [010] and [011] are generated from the threshold distribution B1, and the threshold distributions [001] and [101] are generated from the threshold distribution B2.

Write steps according to the third embodiment will now be specifically described hereinafter.

As shown in FIG. 23, at the first step, $2^y$ threshold distributions A and B are generated based on the write data (x bits). However, in this example, x=3 and y=1.

First, in the controller, based on the write data (the x bits), y bit indicative of whether a write operation is to be executed is generated (step ST11).

For example, when data conversion circuit 22 depicted in FIG. 6 is used, generated data (the y bit) d of "0" or "1" can be obtained in accordance with a value of first, second, and third page data.

That is, as shown in FIG. 7, when the value of the first, second, and third page data [the third page data, the second page data, and the first page data] is [111], [110], [100], or [000], the generated data d is "1". Additionally, when the value of the first, second, and third page data [the third page data, the second page data, and the first page data] is [010], [011], [001], or [101], the generated data d is "0".

Subsequently, this generated data (the y bit) d is transferred from the controller to the nonvolatile semiconductor memory (step ST12).

Further, in the nonvolatile semiconductor memory, the write operation is executed based on the generated data (the y bit) d (step ST13).

Therefore, for example, the write operation is inhibited when the generated data d is "1", and the write operation is permitted when the generated data d is "0", whereby the $2^y$ threshold distributions A and B can be generated based on the generated data (the y bit) d.

It is to be noted that a state after end of the first step is called, e.g., a first rough write state.

As shown in FIG. 24, at the second step, $2^w$ threshold distributions A1, A2, B1, B2 are generated based on the write data (the x bits). However, in this example, x=3, y=1, and w=2. Additionally, w is an integer, and y<w<x is achieved.

First, in the controller, based on the write data (the x bits), w bits indicative of whether the write operation is to be executed are generated (step ST21).

For example, when data conversion circuit 22 depicted in FIG. 17 is utilized, each generated data (the w bits) d2, d1 of "11", "01", "00", or "10" can be obtained in accordance with the value of the first, second, and third page data.

That is, as shown in FIG. 25, each generated data d2, d1 is "11" when the value of the first, second, and third page data [the third page data, the second page data, the first page data] is [111] or [110], and each generated data d2, d1 is "01" when the value of the first, second, and third page data [the third page data, the second page data, the first page data] is [100] or [000].

Further, each generated data d2, d1 is "00" when the value of the first, second, and third page data [the third page data, the second page data, the first page data] is [010] or [011], and each generated data d2, d1 is "10" when the value of the first, second, and third page data [the third page data, the second page data, the first page data] is [001] or [101]

Then, each generated data (the y bits) d2, d1 is transferred from the controller to the nonvolatile semiconductor memory (step ST22).

Furthermore, in the nonvolatile semiconductor memory, the write operation is executed based on each generated data (the w bits) d2, d1 (step ST23).

Therefore, for example, the write operation is inhibited when each generated data d2, d1 is "11", and the write operation is permitted when each generated data d2, d1 is "01", "00", or "10", whereby the $2^w$ threshold distributions A1, A2, B1, and B2 can be generated based on each generated data (the w bits) d2, d1.

However, in the write permission, when a verify level is set to differ depending on the value of each generated data d2, d1, i.e., "01", "00", or "10", data can be written on each different threshold level.

It is to be noted that a state after end of the second step is called, e.g., a second rough write state.

As shown in FIG. 26, at the third step, $2^x$ threshold distributions [111], [110], [100], [000], [010], [011], [001], and [101] are generated based on the write data (x bits). In this example, however, x=3.

First, the write data (x bits) is transferred from the controller to the nonvolatile semiconductor memory (step ST31).

Further, in the nonvolatile semiconductor memory, write and verify operations are repeated based on the write data (the x bits) to generate the $2^x$ sharp threshold distributions [111], [110], [100], [000], [010], [011], [001], and [101] (step ST32).

For example, the threshold distributions [111] and [110] are generated from the threshold distribution A1, the threshold distributions [100] and [000] are generated from the threshold distribution A2, the threshold distributions [010] and [011] are generated from the threshold distribution B1, and the threshold distributions [001] and [101] are generated from the threshold distribution B2.

The third embodiment can be modified as follows.

Figure 27:
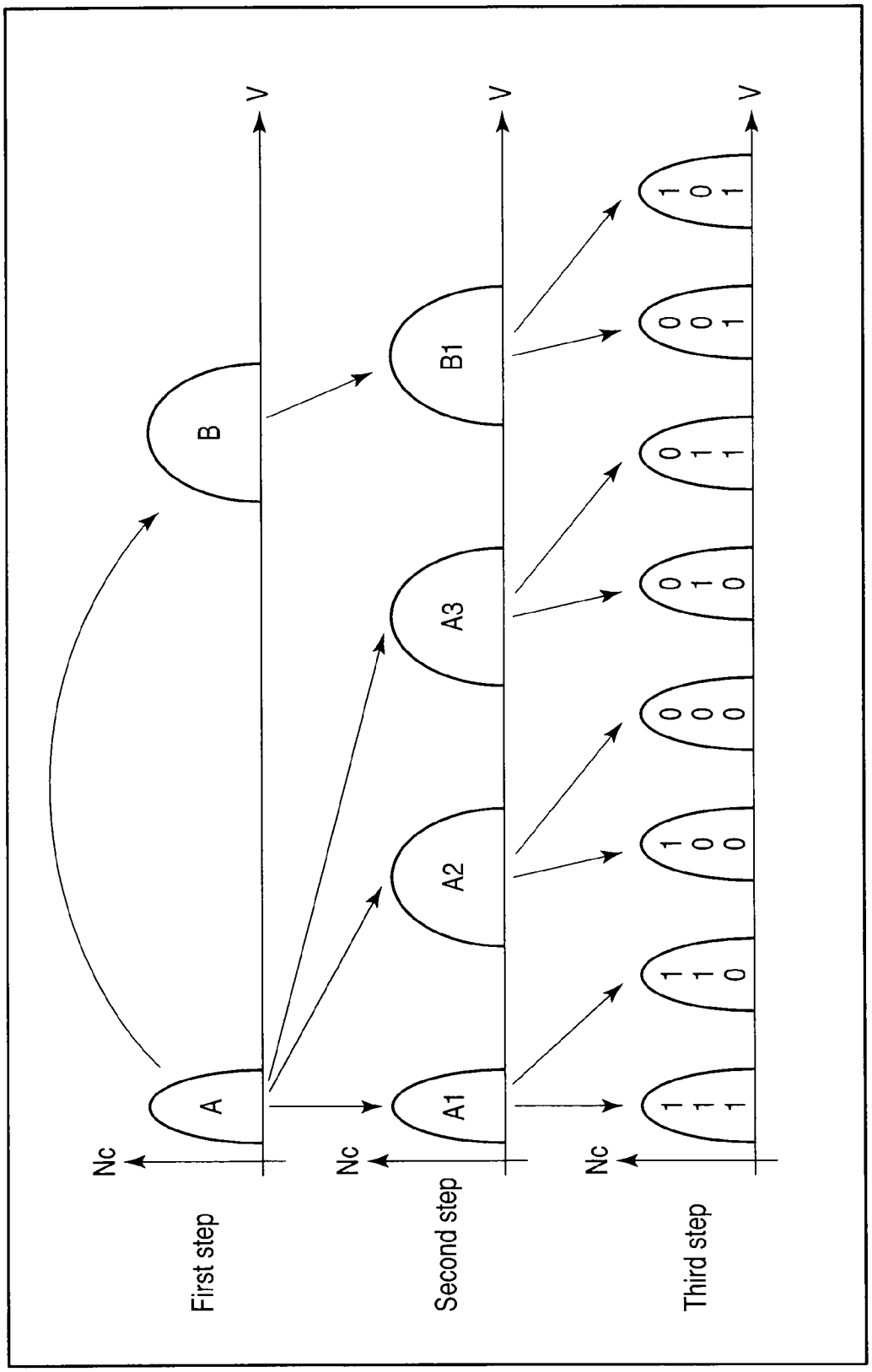
FIG. 27 shows threshold distributions generated by first to third steps.

FIG. 27 shows write steps as a modification of the third embodiment.

This modification is characterized in that y bit is generated based on z bits (z is an integer, and z<x is achieved) in write data (x bits) at the first step.

For example, based on lower two bits (first and second page data) in write data (three bits), one bit indicative of whether a write operation is to be executed is generated.

The write steps according to the modification will now be specifically described hereinafter.

Figure 28:
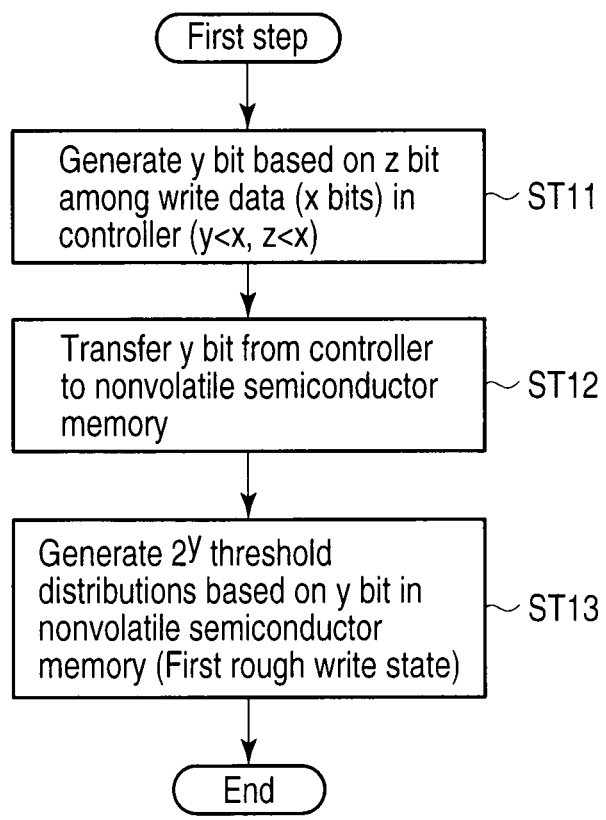
FIG. 28 shows a flow chart of the first step.

As shown in FIG. 28, at a first step, $2^y$ threshold distributions A and B are generated based on z bits in write data (x bits). In this example, however, x=3, y=1, and z=2.

First, in the controller, based on the lower z bits in the write data (the x bits), the y bit indicative of whether the write operation is to be executed is generated (step ST11).

For example, when data conversion circuit 22 depicted in FIG. 12 is used, generated data (the y bit) of "0" or "1" can be obtained in accordance with a value of first and second page data.

That is, as shown in FIG. 13, when a value of the first and second page data [the second page data and the first page data] is [01], the generated data is "0". Moreover, when the value of the first and second page data is any other value, the generated data is Subsequently, this generated data (the y bit) is transferred from the controller to the nonvolatile semiconductor memory (step ST12).

Additionally, in the nonvolatile semiconductor memory, the write operation is executed based on the generated data (the y bit) (step ST13).

Therefore, for example, the write operation is inhibited when the generated data is "1", and the write operation is permitted when the generated data is "0", whereby $2^y$ threshold distributions A and B can be generated based on the generated data.

It is to be noted that a state after end of the first step is called, e.g., a first rough write state like the third embodiment.

Second and third steps are equal to those in the third embodiments, thereby omitting a detailed description. In this modification, however, at the second step, threshold distributions A1, A2, and A3 are generated from the threshold distribution A, and a threshold distribution B1 is generated from the threshold distribution B.

According to a combination of the third embodiment and the modification thereof, x is 3, y is 1, w is 2, and z is 2.

As described above, according to the third embodiment and the modification thereof, since the data conversion circuit configured to generate the bit indicative of the write inhibition/permission is provided on the controller side, a data transfer time from the controller to the nonvolatile semiconductor memory at the time of the write operation can be shortened.

3. Application Example

It is effective to apply the first to third embodiments to an NAND flash memory that a bit assignment of multilevel data meets Conditions 1 and 2 described above. In this case, an error correction efficiency and a read speed can be simultaneously improved.

Further, in a multilevel NAND flash memory, to improve a read speed, a bit assignment for averaging a read time for each page has been suggested. When executing a write operation in accordance with this bit assignment, applying the first to third embodiments enables shortening a write time based on a reduction in data transfer time.

4. Conclusion

According to the embodiments, a data transfer time from the controller to the nonvolatile semiconductor memory at the time of a write operation can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multilevel nonvolatile semiconductor memory system comprising:
   a nonvolatile semiconductor memory;
   a controller which controls an operation of the nonvolatile semiconductor memory in a data program; and
   a data bus which connects the nonvolatile semiconductor memory to the controller;
   wherein the nonvolatile semiconductor memory comprises:
      a memory cell array with memory cells which have a bit assignment to $2^x$ (x is an integer number of 3 or more) threshold distributions, each memory cell storing x bits; and
      a control circuit which controls the data program of x bits to the memory cells;
   wherein the controller is configured to:
      execute the data program by first, second, and third steps;
      generate $2^y$ threshold distributions (y is an integer number and y<x) by the first step; and
      generate $2^x$ threshold distributions from $2^y$ threshold distributions by the second and third steps;
   wherein the controller comprises a data conversion circuit which generates y bit which indicates a write inhibition/permission from x bits by executing a logical operation of x bits in the first step;
   wherein the controller is further configured to:
      generate the $2^y$ threshold distributions based on y bit by transferring y bit to the nonvolatile semiconductor memory in the first step.

2. The system of claim 1,
   wherein the data program is completed by the first, second, and third steps.

3. The system of claim 1,
   wherein the data conversion circuit generates y bit based on z bit (z is an integer number and z<x) among x bits in the first step.

4. The system of claim 1,
   wherein the bit assignment is decided under the condition of:
   differing one bit among x bits of one of two threshold distributions adjacent to each other from one bit among x bits of the other one of the two threshold distributions, and
   having two or more variation points between "0" and "1" in a page data which comprises a group of one bit among x bits assigned to each of the $2^x$ threshold distributions.

5. The system of claim 1,
   wherein the $2^x$ threshold distributions are generated by transferring x bits from the controller to the nonvolatile semiconductor memory.

6. The system of claim 1,
   wherein x is 3, and y is 1.

7. The system of claim 1,
   wherein x is 3, and y is 2.

8. The system of claim 3,
   wherein x is 3, y is 1, and z is 2.

9. A multilevel nonvolatile semiconductor memory system comprising:
   a nonvolatile semiconductor memory;
   a controller which controls an operation of the nonvolatile semiconductor memory in a data program; and
   a data bus which connects the nonvolatile semiconductor memory to the controller;

wherein the nonvolatile semiconductor memory comprises:
  a memory cell array with memory cells which have a bit assignment to $2^x$ (x is an integer number of 3 or more) threshold distributions, each memory cell storing x bits; and
  a control circuit which controls the data program of x bits to the memory cells;
wherein the controller is configured to:
  execute the data program by first, second, and third steps;
  generate $2^y$ threshold distributions (y is an integer number and y<x) by the first step;
  generate $2^w$ threshold distributions (w is an integer number and y<w<x) from the $2^y$ threshold distributions in the second step; and
  generate $2^x$ threshold distributions from the $2^w$ threshold distributions in the third step;
wherein the controller comprises a data conversion circuit which generates y bit which indicates a write inhibition/permission from x bits by executing a logical operation of x bits in the first step, and which generates w bit which indicates a write inhibition/permission from x bits by executing a logical operation of x bits in the second step;
wherein the controller is further configured to:
  generate the $2^y$ threshold distributions based on y bit by transferring y bit to the nonvolatile semiconductor memory in the first step; and
  generate the $2^w$ threshold distributions based on w bit by transferring w bit to the nonvolatile semiconductor memory in the second step.

10. The system of claim 9,
wherein the data program is completed by the first, second, and third steps.

11. The system of claim 9,
wherein the data conversion circuit generates y bit based on z bit (z is an integer number and z<x) among x bits in the first step.

12. The system of claim 9,
wherein the bit assignment is decided under the condition of:
differing one bit among x bits of one of two threshold distributions adjacent to each other from one bit among x bits of the other one of the two threshold distributions, and
having two or more variation points between "0" and "1" in a page data which comprises a group of one bit among x bits assigned to each of the $2^x$ threshold distributions.

13. The system of claim 9,
wherein the $2^x$ threshold distributions are generated by transferring x bits from the controller to the nonvolatile semiconductor memory.

14. The system of claim 9,
wherein x is 3, y is 1, and w is 2.

15. The system of claim 11,
wherein x is 3, y is 1, w is 2, and z is 2.

16. The system of claim 9,
when x is 3,
the data conversion circuit includes first, second, third and fourth AND circuits, and first and second OR circuits,
a first page data is supplied to a first input terminal of the second AND circuit, an inversion data of the first page data is supplied to a first input terminal of the fourth AND circuit,
a second page data is supplied to a first input terminal of the first AND circuit, an inversion data of the second page data is supplied to a second input terminal of the second AND circuit, the second page data is supplied to a first input terminal of the third AND circuit, the inversion data of the second page data is supplied to a second input terminal of the fourth AND circuit,
a third page data is supplied to a second input terminal of the first AND circuit, the third page data is supplied to a third input terminal of the third AND circuit,
output terminals of the first and second AND circuits are connected to an input terminal of the first OR circuit, and output terminals of the third and fourth AND circuits are connected to an input terminal of the second OR circuit.

* * * * *